(12) United States Patent
Atherton et al.

(10) Patent No.: US 10,430,525 B2
(45) Date of Patent: Oct. 1, 2019

(54) RECONFIGURABLE SPACES

(71) Applicant: Autodesk, Inc., San Rafael, CA (US)

(72) Inventors: Evan Patrick Atherton, Foster City, CA (US); Mark Thomas Davis, Mill Valley, CA (US); Heike Rapp-Wurm, San Francisco, CA (US); Arthur Harsuvanakit, San Francisco, CA (US); Negar Arabani, Mill Valley, CA (US); Erin Marie Bradner, Berkeley, CA (US); James La Fleur, San Rafael, CA (US)

(73) Assignee: Autodesk, Inc., San Rafael, CA (US)

( * ) Notice: Subject to any disclaimer, the term of this patent is extended or adjusted under 35 U.S.C. 154(b) by 1514 days.

(21) Appl. No.: 14/274,508

(22) Filed: May 9, 2014

(65) Prior Publication Data
US 2017/0177747 A1    Jun. 22, 2017

(51) Int. Cl.
    G06F 17/50    (2006.01)
(52) U.S. Cl.
    CPC ................. G06F 17/5004 (2013.01)
(58) Field of Classification Search
    None
    See application file for complete search history.

(56) References Cited

U.S. PATENT DOCUMENTS

| | | | | |
|---|---|---|---|---|
| 2003/0198923 | A1* | 10/2003 | Westra | E04B 2/827 434/226 |
| 2005/0086876 | A1* | 4/2005 | Clark | E04B 2/827 52/79.1 |
| 2006/0012611 | A1* | 1/2006 | Dujmich | G06F 17/5004 345/619 |
| 2008/0126023 | A1* | 5/2008 | Hoguet | G06F 17/5004 703/1 |
| 2014/0172731 | A1* | 6/2014 | Ericksen | G06Q 10/105 705/320 |

* cited by examiner

*Primary Examiner* — Hugh M Jones
*Assistant Examiner* — Bernard E Cothran
(74) *Attorney, Agent, or Firm* — Fish & Richardson P.C.

(57) ABSTRACT

Methods, systems, and apparatus, including computer programs encoded on a computer storage medium, for reconfigurable spaces. One of the methods includes identifying plan information relating to a space under evaluation. Constraints related to structures associated with the plan information are identified. Input regarding uses or elements to be included in a reconfigurable design for the space is received. A library of elements for inclusion in the space is evaluated, including determining one or more reconfigurable elements that satisfy the received input. A first configuration of a reconfigurable element is determined including a first placement in a first design associated with the space, and the first design in accordance with the first configuration is presented. A second different configuration is determined, including a second placement in a second different design associated with the space, and the second different design in accordance with the second different configuration is presented.

66 Claims, 5 Drawing Sheets

RECONFIGURABLE SPACES

BACKGROUND

Computer-aided design ("CAD") software can aid in generating, optimizing, or analyzing designs for products, architecture, or terrain. CAD software generally can read, modify and output electronic files that define a particular design. A user of CAD software can create two-dimensional designs, e.g., with 2D vector-based drafting, or three-dimensional designs, e.g., with solid and surface models. CAD software can include templates of shapes and designs that a user can combine to produce a model.

CAD software can be run on devices, i.e., computers, mobile devices, or be hosted in a data center and provided to a remote device using a display protocol. A user can generally interact with CAD software using a mouse, keyboard or other peripheral, and in the case of certain devices, by swiping or touching a touch-sensitive display.

SUMMARY

This specification describes technologies relating to computer-aided design.

In general, one innovative aspect of the subject matter described in this specification can be embodied in methods that include the actions of identifying plan information relating to a space under evaluation; identifying constraints related to structures associated with the plan information; receiving input regarding uses or elements to be included in a reconfigurable design for the space; evaluating a library of elements for inclusion in the space including determining one or more reconfigurable elements that satisfy the received input, wherein the evaluating is based at least in part on the plan information, the constraints and the input; determining a first configuration of a reconfigurable element of the one or more reconfigurable elements including a first placement in a first design associated with the space and presenting the first design including the reconfigurable element in accordance with the first configuration; and determining a second different configuration of the reconfigurable element including a second placement in a second different design associated with the space and presenting the second different design including the reconfigurable element in accordance with the second different configuration, wherein the method further includes identifying one or more additional elements required to reconfigure the reconfigurable element into the first and second different configurations and adding the one or more additional elements into the first and second different designs.

The foregoing and other embodiments can each optionally include one or more of the following features, alone or in combination. The plan information includes a plan that is selected from the group comprising a floor plan, a footprint or a lot plan. Identifying constraints includes determining whether one or more structures that are included in the space are or are not reconfigurable. Evaluating the library includes determining a reconfigurable element for at least one of the reconfigurable structures that is included in the space. Identifying constraints includes receiving constraint information from a user that identifies constraints associated with the space. Receiving input includes receiving at least two uses for the space and wherein determining the reconfigurable element is performed so as to enable satisfaction of plural uses of the at least two uses. Receiving input includes receiving an indication of an element to include in the first and second different designs, and wherein the method further includes determining a plurality of configurations for the element, determining one or more additional elements that are required to be included in the first and second different designs to enable reconfiguration of the element when in the first design as compared to when in the second different design, and adding the one or more additional elements to the first and second different designs. The evaluating is automatic and wherein determining one or more reconfigurable elements includes determining one or more reconfigurable elements from the library. The first placement and the second placement is the same and the reconfiguration of the reconfigurable element is changed in the first design and second design without changing a position of the reconfigurable element. The first placement and the second placement is different, and wherein the method further includes determining one or more additional elements for inclusion in the first and second designs that are required to enable a change of location of the reconfigurable element from the first location to the second location. Determining a first configuration includes determining a first configuration that is in accordance with a first use that is received as part of the input and wherein determining the second different configuration includes determining a second different configuration of the reconfigurable element that is in accordance with a second different use that is received as part of the input. The reconfigurable element is selected from the group comprising a wall structure, a furniture item, a table structure, a bookshelf, doors, windows, desks, tables, work surfaces, steps, or shelves. The one or more additional elements are selected from the group comprising pivots, tracks, pulleys, running boards. The presenting the first and second different designs includes presenting alternative designs as suggestions to a viewer including different configurations of the reconfigurable element. The actions include receiving an update to one or more of the input including update to a use or element, and the method further comprising determining a new reconfigurable element or reconfiguring the reconfigurable element in accordance with the update. The actions include determining modifications to one or more elements included in the first design or one or more additional elements for inclusion in the first design in order to enable the reconfiguration of the reconfigurable element from the first configuration to the second different configuration. The actions include including the one or more determined additional elements in the first and second different designs. Receiving input includes receiving one or more rules that govern desired uses of the space, configuration of the space or elements in the space, preferences of the user or required elements to be included in one or more of the first or second different designs. The actions include providing the first design to a viewer, receiving input for one or more additional considerations for the space and providing the second different design that incorporates the one or more additional considerations. The actions include prior to evaluating, receiving input that defines the initial first and second different designs without the inclusion of a reconfigurable element, evaluating the initial first and second different designs, and wherein evaluating the library includes determining the reconfigurable element for inclusion in both the first and second different designs based on the evaluating the initial first and second different designs. The actions include identifying one or more additional elements required to reconfigure the reconfigurable element into the first and second different configurations and adding the one or more additional elements into the first and second different designs. The input includes at least two uses and wherein identifying plan information includes suggesting one or more candidate plans and receiving a selection of a plan. The actions include providing a controller for configuring and reconfiguring the space based on the first and second different designs. The received input is parameter based and defines one or more parameters for uses, elements, or configurations of the space. The received input is rules based and defines one or more rules for uses, elements or configurations of the space. Identifying one or more constraints includes identifying one or more of a physical constraint on an element for inclusion in the space or other constraint on the first or second different design. The constraint is a cost of the reconfigurable element or additional elements required to support the first and second configurations.

Particular implementations of the subject matter described in this specification can be implemented so as to realize none, one, or more of the following advantages. A user can input architectural plan information that identifies a plan (such as a floor plan) and proposed uses of the space, and automatically receive different designs for the space that include reconfigurable elements including suggestions for locating or configuring the reconfigurable elements to meet one or more of the proposed uses. The system can present different designs of the space that accommodate the different configurations of the reconfigurable elements. A user can therefore quickly determine optimal placements of elements that maximize the usefulness of the space by incorporating reconfigurable elements.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A system can receive architectural plans and use information for a space, determine elements, e.g., tables, chairs, walls, windows, fixtures, and so on, that are preferable for the space, and provide potential designs to a user. The system can automatically determine/suggest reconfigurable elements, i.e., any element that can have more than one configuration or functions in the space, for inclusion in the space that satisfy one or more of the proposed uses defined by the use information.

In determining elements the system receives input identifying intended uses of the space, any desired elements and constraints. That is, the system can better determine designs of the space with knowledge of the intended use of the space, desired elements and any constraints imposed by the space or the user. For instance if the space is a live/work loft, the system can determine that part of the space should accommodate living, and the other part should accommodate a desk, bookshelf, and other work related elements. The system can identify reconfigurable elements, e.g., a table that can change into a bookshelf, to effect the intended uses of the space, e.g., a live/work loft.

Furthermore the system can receive constraints derived from the plans or directly from a user that identify any constraint elements, e.g., structures in the plan, that are pre-existing within or relate to the space including individual constraints (such as constraints that are particular to a given user or plan). Examples of individual constraints include cost or price constraints. For example, the user can prefer to keep the total cost of the elements within a certain budget, or to see different designs with varying levels of budget.

Figure 1:
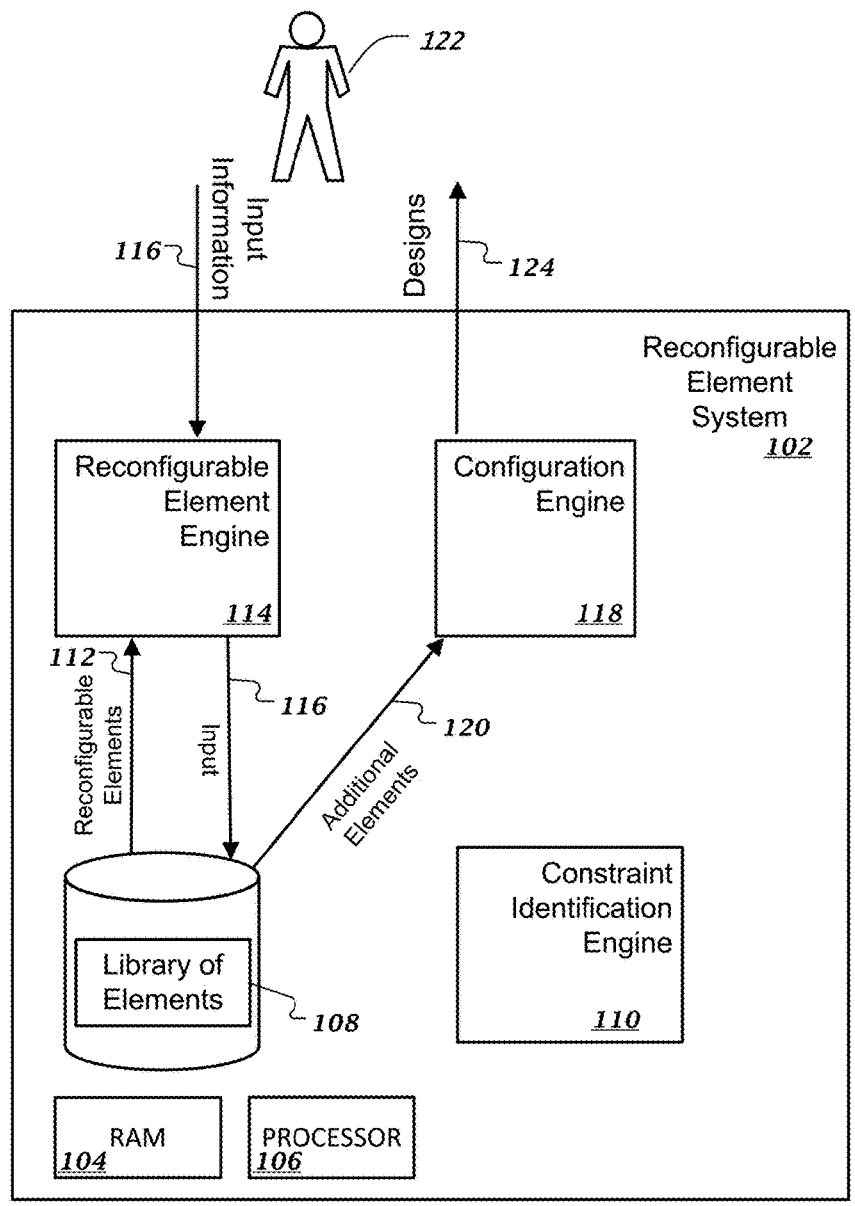
FIG. 1 is a diagram of an example reconfigurable element system.

FIG. 1 is a diagram of an example reconfigurable element system 102. The reconfigurable element system 102 can be implemented as computer programs that are executed on one or more computers in one or more locations, in which the systems, components, and techniques described below, can be implemented.

The reconfigurable element system 102 is configured to identify plan information, e.g., an architectural plan, which relates to a space, a floor plan of an apartment, building, or any arbitrary physical space, a lot or other space layout or description. Plan information can identify any existing structures or elements associated with the plan, e.g., walls, doors, windows, toilets, showers, natural elements (e.g., a large tree in a backyard), additional structures (e.g., a gazebo), or other necessary elements. Identification can include receipt of the plan information from the user 122 or retrieval of the plan information from one or plural sources. In some implementations, a user provides the plan information to the reconfigurable element system 102. In some implementations, the plan information is variable, in that, the plan information can vary depending on uses that are desired. For example, as will be discussed in greater detail below, a user may first specify uses for a space, and the reconfigurable element system 102 may determine available or suitable plan information to support the intended uses. For example, a user may desire to plan for a house to be built on a vacant lot. After specification of the desired intended uses (as discussed in greater detail below), the reconfigurable element system 102 may identify one or more suitable plans that support the intended uses. A user may then select from the identified suitable plans or an automatic selection may be made by the system 102.

Information is received or identified for intended uses of the space by the reconfigurable element system 102. For example, a user 122 can input information 116 about how the space is to be used, who the intended inhabitants of the space are, or any information relevant to the form or function of the space that is desirable. The input information 116 can include one or more preferences such as priorities associated with each intended use, form, or function that is specified. The input information 116 can be specific and include one or more required elements, one or more preferred elements and one or more optional elements. The input information 116 can include multiple uses of the space, e.g., a live/work loft. Other information, such as one or more constraints can be received and processed as well. Constraints are discussed in greater detail below.

The reconfigurable element system 102 includes a library of elements 108, e.g., a database or data structure that includes elements, which the reconfigurable element system 102 can access to obtain elements to place in the space. The elements can include any object or structure that might be placed in real property, e.g., beds, counters, tables, chairs, partitions, lights, fixtures and any object or structure that is used to install or connect an element, e.g., steps, running boards, pivots, hinges, tracks, pulleys, and so on. The library of elements 108 includes reconfigurable elements 112 that can have two or more configurations. By way of illustration, a sliding wall can have a first configuration, e.g., separating two halves of an apartment, and a second configuration, e.g., sliding into a second position to open up the two halves of the apartment into one contiguous space. Examples of reconfigurable elements 112 include walls, doors, windows, desks, tables, work surfaces, steps, shelves, or other platforms that fold flat vertically or horizontally.

The reconfigurable element system 102 includes a constraint identification engine 110 to identify constraints, i.e., any limiting factors of the plan, intended uses, or structures that would preclude use or inclusion of certain elements in a given design. For example, in a plan for a 700 sq. ft. apartment the reconfigurable element system 102 can identify constraints limiting larger structures from being included in the plan. Constraints can be based on specific information, e.g., any structures, included in the plan information. For example, the plan information may show locations of structures, e.g., doors, windows, support walls, or other elements that cannot be changed. Immovable elements can be considered constraints imposed on a given design. The constraint identification engine 110 can evaluate any identified constraints and provide feedback or suggestions to ensure that a compliant design is produced. Constraints can be based on user input, such as to reflect budget or to support required, desired, or optional intended uses of the space. Constraints are discussed in greater detail below.

The reconfigurable element system 102 evaluates the library of elements 108 to identify elements for inclusion in the space using a reconfigurable element engine 114. The reconfigurable element engine 114 determines one or more reconfigurable elements 112 that can be included in the space using the identified plan information, identified constraints, and any input information 116 from a user 122 that identifies uses of the space or elements to be included in the space. The input information 116 can identify, for example, that the space is to be a 700 sq. ft. apartment, and that a user desires a reconfigurable element 112, i.e., a sliding wall, to turn the room from a two room apartment into a studio apartment. The reconfigurable element system 102 can then access the library of elements 108 to obtain elements that fit within the space and meet the desired use or specified requirement. For example, a reconfigurable element can be a table that can transition into a bookshelf To effect the transition, the table can include parts that can fold vertically upwards to create a bookshelf.

After identifying the reconfigurable elements 112 for inclusion in a space, the reconfigurable element system 102 uses a configuration engine 118 to place reconfigurable elements 112 and any additional supporting elements in the space. The configuration engine 118 determines placements of the reconfigurable elements 112 in each of the configurations, e.g., a sliding wall is placed across the middle of a 700 sq. ft. apartment in a first configuration creating two rooms and slid against another wall in a second configuration opening up the apartment. With some reconfigurable elements 112, the placement of the reconfigurable element in each configuration can be identical. For example, a reconfigurable element 112 with a first configuration, e.g., a table, and a second configuration, e.g., a bookshelf created by folding internal elements in the table upwards, can have the same placement (e.g., location).

Furthermore, the configuration engine 118 can identify supporting elements that effect the different configurations of any reconfigurable elements 112. For example, the configuration engine 118 can determine that the sliding wall discussed above needs additional elements 120 such as steps, running boards, pivots, hinges, tracks, or pulleys to allow the different configurations desired by a user.

The configuration engine 118 is further configured to provide to a user 122 different designs 124 of the reconfigurable elements 112 and any supporting additional elements 120. The designs 124 accommodate the different configurations of the reconfigurable elements 112, e.g., the configuration engine 118 provides a first design with a sliding wall in a first configuration, and a second design with the sliding wall in a second configuration.

Figure 2:
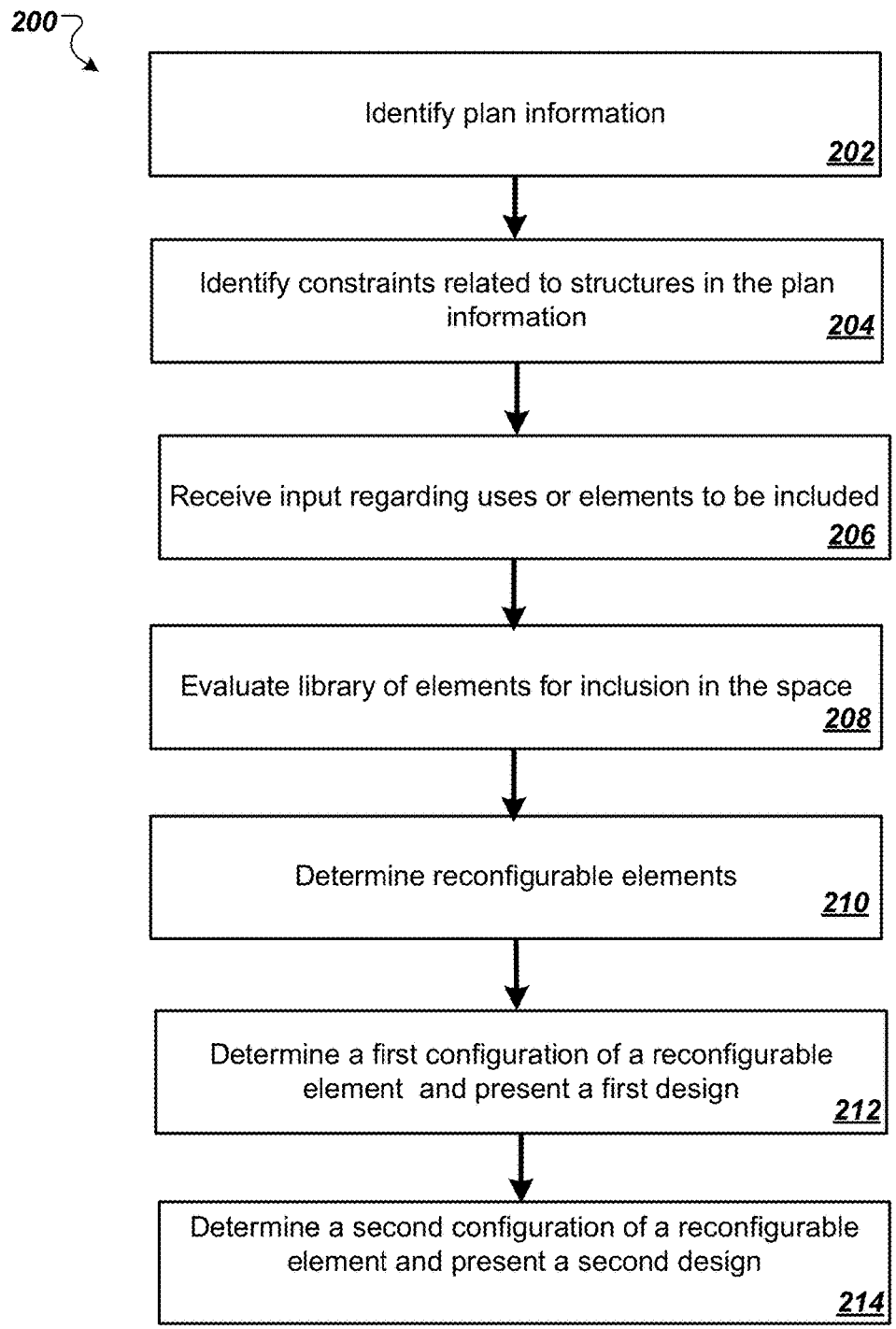
FIG. 2 illustrates an example process for determining configurations of reconfigurable elements.

FIG. 2 illustrates an example process for determining configurations of reconfigurable elements. The process 200 will be described as being performed by a system of one or more appropriately programmed computers, e.g., the reconfigurable element system 102 of FIG. 1.

The system identifies plan information related to a space (step 202). Plan information can include architectural plans, e.g., a floor plan, a footprint, a lot plan, and so on, related to a space under consideration. For instance, a space can include a park, an apartment building, a waterfront, any type of open terrain, or any bounded area. A user can provide (or otherwise designate) the plan information to the system, e.g., a user can input a file that includes plan information, or can manually enter plan information into the system. Plan information can include structures present in the plan, such as a wall, stove, industrial machinery, sink holes or natural elements. In some implementations the user can provide information including none, one, or all of the following: dimensions of each structure, the location of each structure, and whether the structure is reconfigurable with the dimensions, location, and cost of each configuration. The user can also select from a listing or menu of candidate structures. In some other implementations the plan information itself can identify structures.

In some implementations the system can ask the user a series of questions and generate plan information. For example the system can request information related to the size of the space, or the layout desired. Furthermore, the system can provide candidate plans of spaces, e.g., a candidate plan for a one bedroom apartment, an industrial center, or an office. A user can then select from the candidate plans, and modify attributes associated with the candidate plans, e.g., an attribute that identifies the square footage of the candidate plan, attributes that identify a shape of the plan, and so on.

In some implementations the system can receive designs for the space that already include elements, but no reconfigurable elements. That is, the system can receive from the user previously determined designs, or designs created manually by the user. The system then can determine reconfigurable elements to include in the space, to optimize the functionality of the space.

The system identifies constraints (e.g. structures) associated with or related to the plan information (step 204). A constraint can be any limiting factors of or related to the plan, e.g., cost, size, location, which would limit or preclude certain elements, e.g., tables, chairs, desks, couches, industrial machinery, or other elements, or reconfigurable elements from being included in the space. The system can identify constraints using the identified plan information.

That is, the system can determine from the structures identified by or associated with the plan information, limitations on a number, type, size, location, or cost of elements. The system can also receive information from the user that identifies constraints.

Constraints can identify locations, and bounded regions, that an element cannot intrude upon. For instance, a constraint can identify both a location of the structure and the size, e.g., a fixed gazebo present in a backyard. Furthermore a constraint can identify only a size, e.g., a constraint identifying that the gazebo can be moved around the backyard.

Constraints can also identify an overall budget associated with the plan, a maximum budget for an element, a maximum budget for a class of elements, e.g., dinner tables and dinner chairs can be included in a class about dinner table ware, specific types of industrial machinery can be included in a class, bath tubs can be included in a class, or an average budget for the elements or class of elements. Furthermore a constraint can be associated with the cost of additional elements required to connect or configure elements, or effect multiple configurations of a reconfigurable element, e.g., pulleys, running boards, and so on.

Furthermore the system can determine whether one or more structures included in the space are reconfigurable. That is, the system can identify multiple configurations of a structure, e.g., a wall that can slide into a different position, and identify constraints that satisfy both of the configurations. For instance, a reconfigurable dining table can have a first configuration where the table is unextended and a second configuration where the table has been extended to seat more people. The system can identify a constraint that the second configuration, e.g., the extended table, must fit inside of a dining room.

Additionally, particular structures, such as a first piece of machinery that connects to a second piece of machinery to function, can be identified as being part of a single functional unit, e.g., the first and second pieces of machinery connected. The system can identify a constraint that the two structures need to be located in a particular configuration. In some implementations, the system can access a database that includes specific structures and their configurations with other structures. For instance, the database can identify that when two particular structures are identified in a plan, the two structures comprise a single functional unit. Furthermore, when the database determines that there are a multitude of configurations for the structures, input can be received from, for example, the user to determine the correct configuration. In some implementations the user can provide information to the system identifying that two structures need to be in a particular configuration.

The system receives input regarding uses or elements to be included in a reconfigurable design (step 206). The system receives input identifying a use of the space, e.g., commercial use, recreational use, residential use, industrial use, and so on. In some implementations the system can receive more than one use, e.g., a house with an attached rental in-law unit, or a store also used as a restaurant at night. The system can provide to the user a list or menu of possible uses. In some implementations the system can present overarching categories of uses, e.g., commercial or residential use, and receive a selection of a primary category of use. The system can then present a list or menu of more detailed uses, e.g., for a commercial use the system can present a restaurant, or store, for a residential use the system can present an apartment or stately manor. Furthermore the system can receive multiple categories and blend the uses, e.g., a user can select commercial and residential and be presented with a house and attached in-law rental unit.

The input can identify elements that the user wants included in the space. For instance, the user can identify that a stove, dining table, dining chairs, and table-top needs to be included in the space. The user can also identify a location, or approximate location, that the elements are to be included in. For instance a user can provide information that the stove needs to be located in a particular room, and the dining tables in a separate or same room.

The user can provide rules that define uses, elements, or configurations of the space. A rule can define that a particular room is to be used for a first use, e.g., an in-law short-term rental unit, and another room is to be associated with a different second use, e.g., a residential use. Furthermore, the user can provide a rule that a stove needs to be located in a particular room, and a rule that a dining table needs to be located in a different particular room. Alternatively, the user can provide a rule that the dining table and kitchen need to be in different rooms, without defining the location of either element. The user can provide a rule that particular elements be included near, or within a certain distance, of other elements. For example, a user can provide a rule that a work desk be located within 10 feet of a bookshelf and within a threshold range of a door. The user can provide the rule as text, e.g., 'element X located 5 feet from element Y', or the system can provide a graphical view of the space and receive a rule, e.g., the user can place two elements on the space, or make a selection of two elements and define the distance on the graphical view.

Additionally, rules can define complex relationships between uses and configurations of elements. For instance, a user can provide a rule that a space has a first use, e.g., a store, and a second use, e.g., a restaurant, depending on the configuration of a reconfigurable element. That is, the user can define that the space is to be a restaurant when a reconfigurable element, a table that extends from a wall, is in the extended position, and the space is to be a store when the table is hidden in the wall.

The user can provide parameters that define uses, elements, or configurations of the space. A parameter is a specific identification of a use, element or configuration, e.g., a parameter can define a location of an element, a specific use, or a specific use that depends on a specific reconfigurable element in a specific configuration. Furthermore, a parameter can define attributes of a particular element, for example a parameter can identify a minimum radius around an element, or a specific cost of an element, or specific range of costs of an element. Parameters can further identify dimensions of any aspect of a particular space, including a wall or perimeter lengths, ceiling height, door or window width, or the dimensions of any of the elements above.

The system evaluates a library of elements to identify particular elements for inclusion in the space (step 208). The system determines elements that can be included in the space based on the plan information, the identified constraints, and the input identifying uses or elements of the space. In some implementations the system can receive input that identifies multiple uses of the space. In some implementations the system can obtain elements for each use. In some implementations, elements that the user has identified will be selected from the library of elements without any further processing for inclusion in the space. In some implementations, elements that the user has identified will be analyzed according to any identified constraints, and input identifying uses. When the system determines that the user inputted elements should not be included in the space, e.g., the element won't fit or is too costly for a specified budget, the system can prompt the user and/or offer similar elements, i.e., elements that are similar in functionality, appearance, or of a lower cost.

The system accesses a library of elements to determine elements that fit the plan information, constraints, and input. In some implementations the library of elements can be broken up into categories of elements, e.g., different tables can be stored in a table category, and different swimming pools can be stored in a swimming pool category. Furthermore, within each category the elements can be further categorized by size, or cost of the element. The library of elements can also store potential use information for each element, e.g., a table can be used for commercial, residential, or industrial uses, and a high-tech assembly device can only be for an industrial use.

In some implementations the system can generate/or identify rules that satisfy the identified plan information, constraints, and received input. The rules can then be applied to the library of elements, and the system can obtain elements from the library. For example, the system can first identify elements in the library of elements that satisfy a received use. As described above, in some implementations the library of elements can identify potential uses for each element. The system can identify elements that include a received use in the potential uses for each element. The system can then filter the elements that satisfy a use, to remove elements that don't satisfy the identified constraints, and the plan information. That is, the system can remove elements too large, or too costly, to be placed in the space.

In some implementations the system can store templates that define elements likely to be included in a space based on a received use. For instance, if the space is an apartment, the system can access a template related to residential apartments, and obtain elements, e.g., bed frame, desk, kitchen elements, couch, bookshelf, lights, and so on. The system can refine the elements obtained from the template by the identified constraints. The system can discard elements that are out of budget, and replace them with other elements that are similar, e.g., a dining room table can be replaced with a cheaper dining room table.

Particular elements that the system determines as satisfying plan information, received uses, and constraints, such as a stove, oven, and counter tops, can be identified by the system as being linked together to form a functional unit, e.g., kitchen ware. These elements might all fit separately in a space identified by a plan, but not fit close to each other as a functional unit. The system can treat the elements as part of a single functional unit, and determine whether the functional unit satisfies each of the received constraints, e.g., whether the functional unit is too large or too costly. The system can replace elements included in a functional unit to satisfy any received constraint, e.g., replace the stove with a smaller or less costly stove.

The system determines reconfigurable elements from the evaluated elements (step 210). The system can access a library of elements and identify reconfigurable elements that satisfy the received input, e.g., input regarding uses, and that are included in the evaluated elements. In some implementations the system can access templates, or rules, that identify reconfigurable elements for each of a variety of uses. The system can then filter the reconfigurable elements identified by a particular template by removing reconfigurable elements that are not included in the evaluated elements. For instance, if the space is a dorm room, the system can identify one or more reconfigurable elements from a dorm room template, e.g., a raised bed with a connected desk below it that can transform into a separate bed and a separate desk, and a table that transforms vertically into a bookshelf. The system can then filter the reconfigurable elements to include only reconfigurable elements that are included in the evaluated elements.

The templates can be specific to particular uses, e.g., a dorm room, or can encompass general uses, e.g., residential uses. Since the reconfigurable elements are included in the evaluated elements, a reconfigurable element will satisfy any identified constraints, e.g., size, or cost, that are related to the space. Therefore, reconfigurable elements from templates that encompass only general uses, e.g., residential uses, will be filtered to satisfy the constraints by only including reconfigurable elements that are included in the evaluated elements. In this way the system won't include a reconfigurable element designed for a stately manor, if the constraints and plan information identify a dorm room.

Additionally, the system can identify a reconfigurable element that can effect multiple uses of the space. For example, if the user input identifies that the space is to be used as a restaurant, and a store, the system can identify that one of the reconfigurable elements is a table that can extend from, and recede into, the wall. The system can access two templates, one for the restaurant and one for the store, and determine reconfigurable elements that are identified in both templates.

Furthermore, the system can determine reconfigurable elements for any reconfigurable structures. For instance, a reconfigurable structure can be a table that extends from and recedes back into a wall. The system can determine to include an end table that can fold out into a chair. For example, when the reconfigurable structure is in a first configuration, e.g., the table is receded into the wall, the reconfigurable element can be in a first configuration, e.g., the end table can store products on it. When the reconfigurable structure is in a second configuration, e.g., the table is extended from the wall, the reconfigurable element can be in a second configuration, e.g., the end table can fold out into a chair to sit at the table.

Figure 3A:
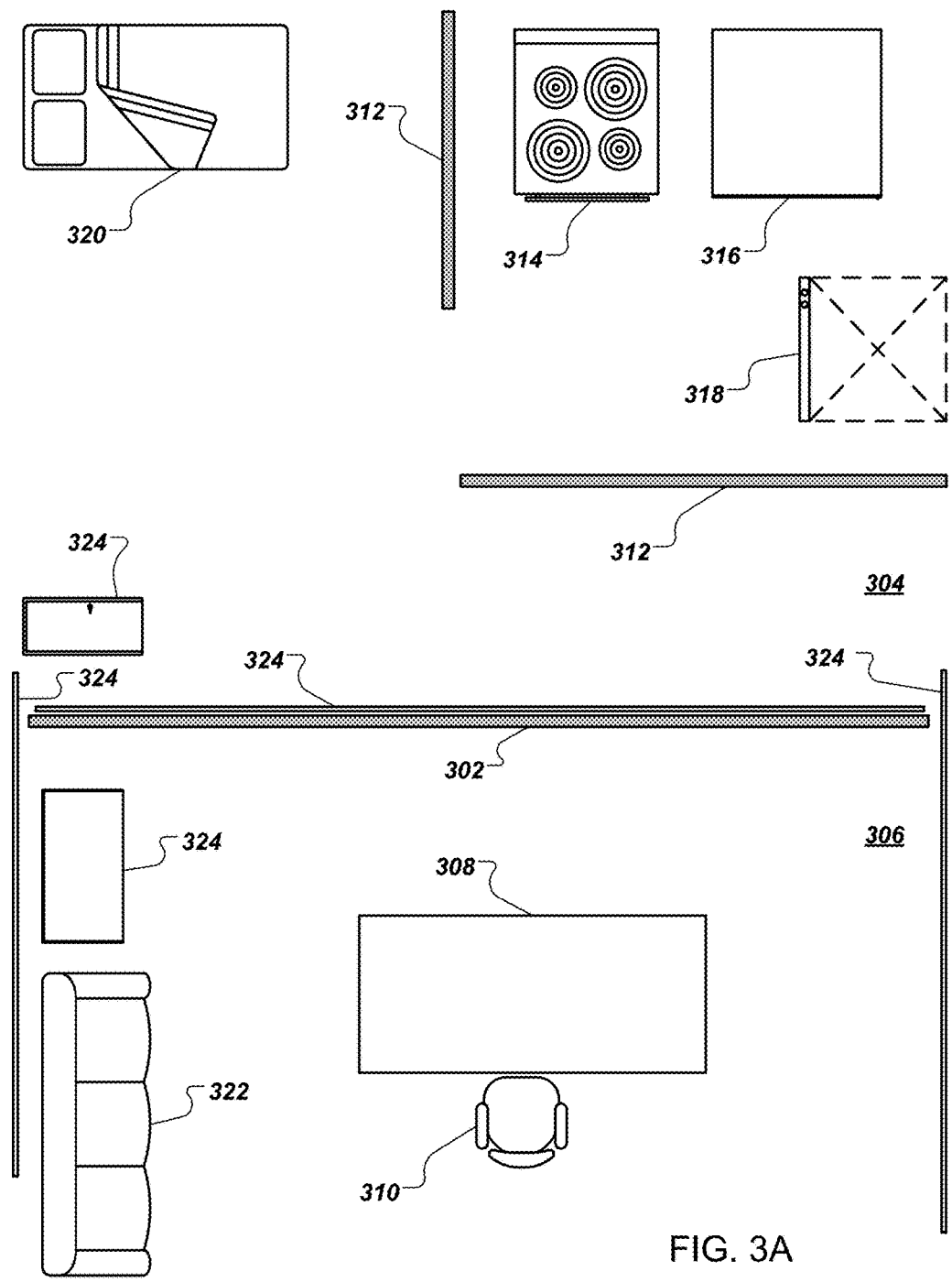
FIG. 3A illustrates an example design with a reconfigurable element in a first configuration.

The system determines a first configuration of a reconfigurable element and presents a first design (step 212). The system selects a first configuration of the determined reconfigurable element, and determines a first design that includes the reconfigurable element. The system determines a location in the space for the reconfigurable element and one or more of the evaluated elements. The system then presents the first design to the user. An example of a first design is illustrated in FIG. 3A, and described below.

In some implementations the system can obtain one or more rules that define general relationships between locations of elements. For instance, a rule can define that a lamp should be placed within a threshold number of feet, e.g., 1 foot, or 2 feet, of a chair. Another rule can define that a dining table should be placed within a threshold number of feet of dining chairs, and ceiling or floor lamps. Another rule can define a minimum distance from a wall to specific elements, or that certain categories of elements should be a minimum distance apart, e.g., bathroom elements a certain distance apart from any other element, or entertainment elements such as a TV stand a certain distance apart from a desk or office. Additionally the rules can specify that particular elements should be grouped in general in the same room, e.g., all kitchen elements should be in a room, or all entertainment elements should be in a room. The rules can specify that particular elements related to a specific use, e.g., commercial use, should be in one room, and other elements, e.g., residential use, should be in a separate room.

In some implementations the system can identify additional elements that are needed to effect multiple configurations of a reconfigurable element. For example, a movable wall separating a room in a first configuration, and moving against another wall to open up the room in a second configuration, can require a running board to transition between configurations. The additional elements can include steps, running boards, pivots, hinges, tracks, pulleys, and so on.

The system determines a second configuration of the reconfigurable element and presents a second design (step 214). The system selects a second configuration of the reconfigurable element and determines a second design that includes the reconfigurable element. The system determines a location for one or more evaluated elements and the reconfigurable element, described above. The evaluated elements determined to be in the second design can be different, or the same, as the elements in the first design. For instance, the second design can remove, exchange, or add elements depending on the use of the space in the second design, or depending on size constraints when the reconfigurable element is in the second configuration. Furthermore the system can present different designs of the second configuration and first configuration in a viewer for display to the user.

Figure 3B:
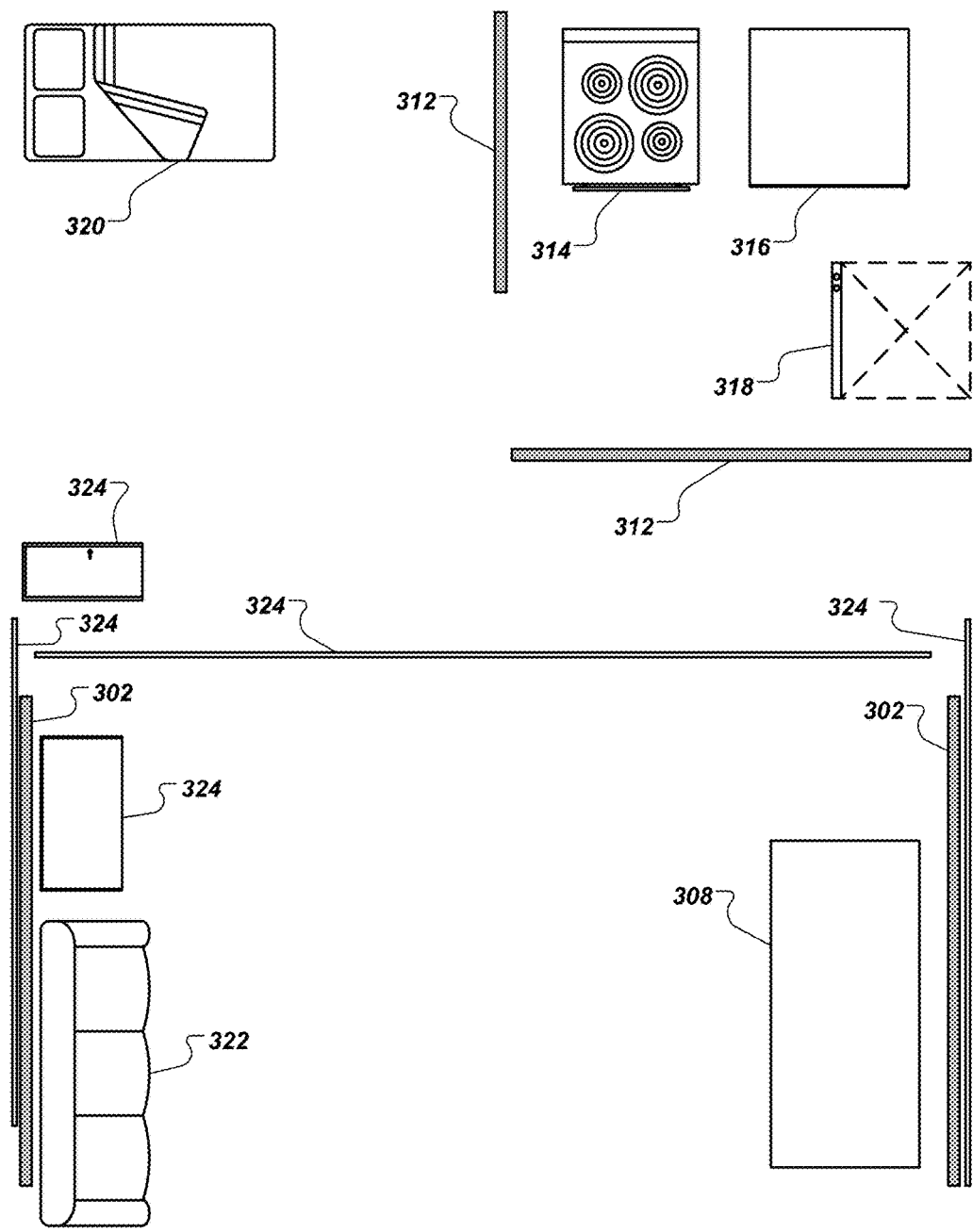
FIG. 3B illustrates an example design with a reconfigurable element in a second configuration.

The system can receive input from the user on the first design, and use any received input from the user to present a second configuration. For example, if the user identified that an element should be exchanged, the system can exchange the element with a similar element, e.g., similar in function, visual look, or cost. In another example, when the user identified a change of a use of the space, the system can reevaluate elements to include new elements based on the new use case, described above with reference to steps 208 and 210. The system then presents the second design to the user. An example of a second design is illustrated in FIG. 3B, and described below.

The system can modify the elements included in the first design to accommodate a reconfigurable element in the second configuration. For example, if the second configuration takes up more area of the space, then an element that is too close to the reconfigurable element might need to be relocated, or replaced with a different element. The system can include additional elements, e.g., pulleys, running boards, pivots, and so on, to allow the transition to the second configuration from the first design.

The second configuration of the reconfigurable element can identify a use different from the use in the first configuration. The system can modify the elements included in the first design to accommodate this second use, e.g., removing elements, modifying locations of elements, or exchanging elements with other evaluated elements.

Furthermore, the system can provide an automated controller to reconfigure the elements in the space based on the first and second designs. That is, in some implementations, once the respective first and second designs are adopted and implemented in a space, a controller can be used to reconfigure the space from a first configuration to a second configuration including reconfiguring any reconfigurable elements in the respective designs automatically. The controller can be associated with a computing system and other electronic or electromechanical elements to enable reconfiguration.

FIG. 3A illustrates an example design with a reconfigurable element in a first configuration. The design includes a reconfigurable element 302 in a first configuration, e.g., a wall separating a room into two sections. The first section, e.g., section 304, is a living area, and the second section, e.g., section 306, is a working area.

In determining the first design, the system has identified plan information for a space, e.g., a live/work studio apartment with a pre-existing kitchen wall structure 312. The system has also received input from a user defining the potential uses of the space, which in this example includes two uses, e.g., a work use and a residential use. The input can also identify any elements to include, e.g., a particular desk 308 and chair 310. Additionally, the input can define the dimensions or cost of the particular desk 308 and chair 310.

The system has identified the kitchen wall 312 as a constraint on the layout of the space, limiting the elements it can place in the space. The system has also received input regarding the uses of the space, e.g., a live/work studio. The input specified a set of rules for the space, for example a received rule could be that the pre-existing structure 312, e.g., the kitchen wall, defines a bounded space for elements in a class of kitchen elements. Further rules could define that each kitchen element be located a certain distance apart from each other, e.g., the stove 314 is within a threshold distance of a counter 316, and a different threshold distance from a refrigerator 318.

After receiving input, the system then evaluated a library of elements for particular elements for inclusion in the space to satisfy the proposed uses. The system has determined kitchen elements, e.g., elements 314, 316, and 318, to place inside of a room bounded by the pre-existing structure 312, a bed 320, and elements for the work use, e.g., elements 308, 310 and sofa 322. The system used the identified constraint associated with the pre-existing structure 312, and the received rules, to identify kitchen elements that fit inside the space bounded by the structure 312.

The system has determined a reconfigurable element, e.g., the wall 302, that satisfies the received input, plan information, and identified constraints. The system determined that a reconfigurable wall separating the contiguous studio space into two separate spaces, e.g., space 304 and space 306, would effect the intended use of the space, e.g., a live/work studio. The wall includes two pieces of retractable wall that connect in the middle of the studio when fully extended, and each piece retracts to respective sides of the studio, illustrated in FIG. 3.B.

The system has determined the first design by placing the reconfigurable element 302 and one or more of the evaluated elements in the space. The system has then provided the first design with the reconfigurable element 302 in a first configuration.

FIG. 3B illustrates an example design with a reconfigurable element in a second configuration. The design includes a reconfigurable element 302 in a second configuration, e.g., two pieces of a wall 302 that retract to separate sides of the space, e.g., the studio. The system has determined to use the same elements as in the first design, except in order to maximize the usefulness of the space the system has changed locations of some elements. For instance, the desk 308 has been placed near a wall of the studio to free up room in front of the couch 322. Since the use of the space with the reconfigurable element in the second position is a residential use, the system has determined to increase the space in front of the couch 322. Furthermore, the system could also have received input indicating a rule that in residential use, the couch 322 and desk 308 are to be more than a threshold distance apart.

The system has identified additional elements 324 needed to allow a transition between a first configuration of the reconfigurable element 302, and the second configuration. For example, the additional elements can include a running board or track on the ceiling that the wall 302 can be hung from or slide along. Furthermore, the system can determine that additional elements 324 are needed on the sides of the studio to receive the wall 302 when it transitions into the second configuration.

Figure 4:
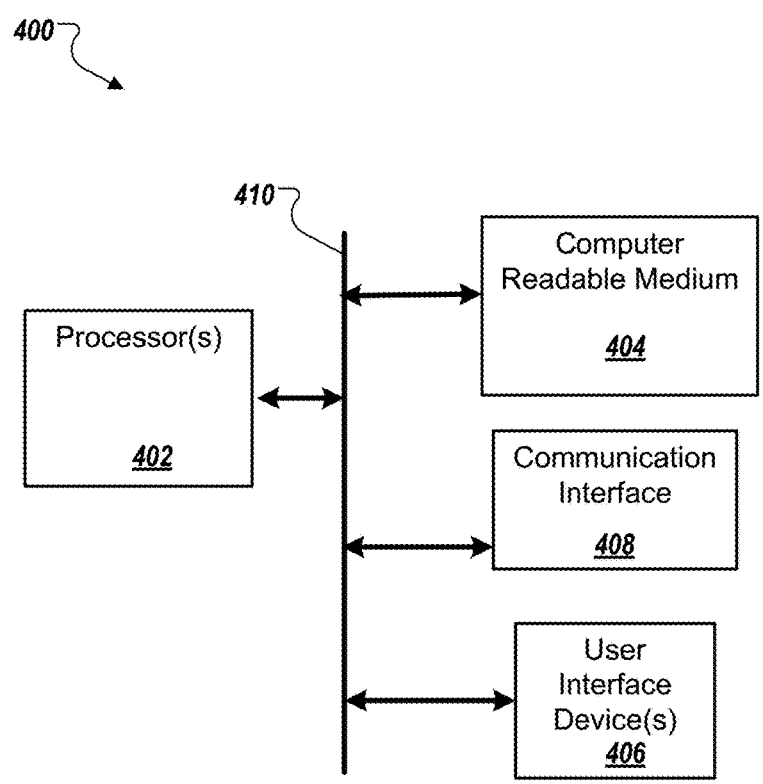
FIG. 4 is a block diagram of an example data processing apparatus that can implement the reconfigurable element system.

FIG. 4 is a block diagram of an example data processing apparatus 400 that can implement the reconfigurable element system. While only one data processing apparatus is shown in FIG. 4, the reconfigurable element system may consist of multiple data processing apparatus.

The data processing apparatus 400 can have hardware or firmware devices connected by a bus 410, including one or more processors 402, computer readable medium 404 to store instructions and data, and one or more user interface devices 406. Examples of user interface devices 406 include a display, a camera, a speaker, a microphone, a tactile feedback device, a keyboard, and a mouse. The data processing apparatus 400 includes a communication interface 408 to communicate with other data processing apparatus over the Internet, a LAN, or a WAN.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer, e.g., processor 106 in FIG. 1. Generally, a processor will receive instructions and data from a read-only memory or a random access memory or both, e.g., random access memory (RAM) 104 in FIG. 1. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A method comprising:

identifying, by a computer-aided design (CAD) system comprising at least one computer programmed to determine and suggest reconfigurable elements for a design, plan information relating to a space under evaluation;

identifying, by the CAD system comprising the at least one computer, constraints related to structures associated with the plan information, wherein identifying constraints includes identifying at least one physical constraint;

receiving, by the CAD system comprising the at least one computer, input regarding uses or elements to be included in a reconfigurable design for the space, wherein receiving the input includes receiving at least a first use and at least a second different use;

evaluating, by the CAD system comprising the at least one computer, a library of elements for inclusion in the space including determining one or more reconfigurable elements that satisfy the received input including the first use and the second different use, wherein each of the one or more reconfigurable elements has more than one structural configuration effecting more than one function in the space, and the evaluating is based at least in part on the plan information, the constraints and the input;

determining, by the CAD system comprising the at least one computer, a first configuration of a reconfigurable element of the one or more reconfigurable elements, in accordance with the first use received as part of the input and in accordance with one or more rules that define relationships between locations of elements in the space, including a first placement in a first design associated with the space and presenting the first design including the reconfigurable element in accordance with the first configuration; and determining, by the CAD system comprising the at least one computer, a second different configuration of the reconfigurable element, in accordance with the second different use received as part of the input and in accordance with the one or more rules that define relationships between locations of elements in the space, including a second placement in a second different design associated with the same space and presenting the second different design including the reconfigurable element in accordance with the second different configuration, wherein the method further includes identifying one or more additional elements required to reconfigure the reconfigurable element into the first and second different configurations and adding the one or more additional elements into the first and second different designs, thereby forming the reconfigurable design for the space; and wherein the presenting the first and second different designs includes presenting alternative designs as suggestions to a viewer including different configurations of the reconfigurable element.

2. The method of claim 1 wherein the plan information includes a plan that is selected from the group comprising a floor plan, a footprint or a lot plan.

3. The method of claim 1 wherein identifying constraints includes determining one or more structures that are included in the space are reconfigurable.

4. The method of claim 3 wherein evaluating the library includes determining a reconfigurable element for at least one other reconfigurable element having more than one structural configuration effecting more than one function when included in the space.

5. The method of claim 1 wherein identifying constraints includes receiving constraint information from a user that identifies constraints associated with the space.

6. The method of claim 1 wherein receiving input includes receiving an indication of an additional reconfigurable element to include in the first and second different designs, and wherein the method further includes determining a plurality of configurations for the additional reconfigurable element, determining one or more additional elements that are required to be included in the first and second different designs to enable reconfiguration of the additional reconfigurable element when in the first design as compared to when in the second different design, and adding the one or more additional elements to the first and second different designs.

7. The method of claim 1 wherein the evaluating is automatic and wherein determining one or more reconfigurable elements includes determining one or more reconfigurable elements from the library.

8. The method of claim 1 wherein the first placement and the second placement is the same and the reconfiguration of the reconfigurable element is changed in the first design and second design without changing a position of the reconfigurable element.

9. The method of claim 1 wherein the first placement and the second placement is different, and wherein the method further includes determining one or more additional elements for inclusion in the first and second designs that are required to enable a change of location of the reconfigurable element from the first location to the second location.

10. The method of claim 1 wherein the reconfigurable element is selected from the group comprising a wall structure, a furniture item, a table structure, a bookshelf, doors, windows, desks, tables, work surfaces, steps, shelves.

11. The method of claim 1 wherein the one or more additional elements are selected from the group comprising pivots, tracks, pulleys, running boards.

12. The method of claim 1 further comprising receiving an update to one or more of the input including update to a use or element, and the method further comprising determining a new reconfigurable element or reconfiguring the reconfigurable element in accordance with the update.

13. The method of claim 1 further comprising determining modifications to one or more elements included in the first design in order to enable the reconfiguration of the reconfigurable element from the first configuration to the second different configuration.

14. The method of claim 1 wherein receiving input includes receiving rules that govern desired uses of the space, configuration of the space and elements in the space, preferences of the user and required elements to be included in one or more of the first or second different designs.

15. The method of claim 1 wherein the method further comprises providing the first design to a viewer, receiving input for one or more additional considerations for the space and providing the second different design that incorporates the one or more additional considerations.

16. The method of claim 1 further comprising prior to evaluating, receiving input that defines the first and second different designs without the inclusion of a reconfigurable element, evaluating the first and second different designs, and wherein evaluating the library includes determining the reconfigurable element for inclusion in both the first and second different designs based on the evaluating the first and second different designs.

17. The method of claim 1 wherein the input includes at least two uses and wherein identifying plan information includes suggesting one or more candidate plans and receiving a selection of a plan.

18. The method of claim 1 further comprising providing a controller for configuring and reconfiguring the space based on the first and second different designs.

19. The method of claim 1 wherein the received input is parameter based and defines one or more parameters for uses, elements, or configurations of the space.

20. The method of claim 1 wherein the received input is rules based and defines one or more rules for uses, elements or configurations of the space.

21. The method of claim 1 wherein identifying constraints includes identifying an other constraint on the first or second different design.

22. The method of claim 21 wherein the other constraint is a cost of the reconfigurable element plus any additional elements required to support the first and second configurations.

23. A system comprising:
one or more computers and one or more storage devices storing instructions that are operable, when executed by the one or more computers, to provide a computer-aided design (CAD) program that determines and suggests reconfigurable elements for a design by causing the one or more computers to perform operations comprising:
identifying plan information relating to a space under evaluation;
identifying constraints related to structures associated with the plan information, wherein identifying constraints includes identifying at least one physical constraint;
receiving input regarding uses or elements to be included in a reconfigurable design for the space, wherein receiving the input includes receiving at least a first use and at least a second different use;
evaluating a library of elements for inclusion in the space including determining one or more reconfigurable elements that satisfy the received input including the first use and the second different use, wherein each of the one or more reconfigurable elements has more than one structural configuration effecting more than one function in the space, and the evaluating is based at least in part on the plan information, the constraints and the input;
determining a first configuration of a reconfigurable element of the one or more reconfigurable elements, in accordance with the first use received as part of the input and in accordance with one or more rules that define relationships between locations of elements in the space, including a first placement in a first design associated with the space and presenting the first design including the reconfigurable element in accordance with the first configuration; and determining a second different configuration of the reconfigurable element, in accordance with the second different use received as part of the input and in accordance with the one or more rules that define relationships between locations of elements in the space, including a second placement in a second different design associated with the same space and presenting the second different design including the reconfigurable element in accordance with the second different configuration, wherein the operations further include identifying one or more additional elements required to reconfigure the reconfigurable element into the first and second different configurations and adding the one or more additional elements into the first and second different designs, thereby forming the reconfigurable design for the space; and wherein the presenting the first and second different designs includes presenting alternative designs as suggestions to a viewer including different configurations of the reconfigurable element.

24. The system of claim 23 wherein the plan information includes a plan that is selected from the group comprising a floor plan, a footprint or a lot plan.

25. The system of claim 23 wherein identifying constraints includes determining one or more structures that are included in the space are reconfigurable.

26. The system of claim 25 wherein evaluating the library includes determining a reconfigurable element for at least one other reconfigurable element having more than one structural configuration effecting more than one function when included in the space.

27. The system of claim 23 wherein identifying constraints includes receiving constraint information from a user that identifies constraints associated with the space.

28. The system of claim 23 wherein receiving input includes receiving an indication of an additional reconfigurable element to include in the first and second different designs, and wherein the operations further include determining a plurality of configurations for the additional reconfigurable element, determining one or more additional elements that are required to be included in the first and second different designs to enable reconfiguration of the additional reconfigurable element when in the first design as compared to when in the second different design, and adding the one or more additional elements to the first and second different designs.

29. The system of claim 23 wherein the evaluating is automatic and wherein determining one or more reconfigurable elements includes determining one or more reconfigurable elements from the library.

30. The system of claim 23 wherein the first placement and the second placement is the same and the reconfiguration of the reconfigurable element is changed in the first design and second design without changing a position of the reconfigurable element.

31. The system of claim 23 wherein the first placement and the second placement is different, and wherein the operations further include determining one or more additional elements for inclusion in the first and second designs that are required to enable a change of location of the reconfigurable element from the first location to the second location.

32. The system of claim 23 wherein the reconfigurable element is selected from the group comprising a wall structure, a furniture item, a table structure, a bookshelf, doors, windows, desks, tables, work surfaces, steps, shelves.

33. The system of claim 23 wherein the one or more additional elements are selected from the group comprising pivots, tracks, pulleys, running boards.

34. The system of claim 23, wherein the operations further comprise receiving an update to one or more of the input including update to a use or element, and the operations further comprising determining a new reconfigurable element or reconfiguring the reconfigurable element in accordance with the update.

35. The system of claim 23 wherein the operations further comprise determining modifications to one or more elements included in the first design in order to enable the reconfiguration of the reconfigurable element from the first configuration to the second different configuration.

36. The system of claim 23 wherein receiving input includes receiving rules that govern desired uses of the space, configuration of the space and elements in the space, preferences of the user and required elements to be included in one or more of the first or second different designs.

37. The system of claim 23 wherein the operations further comprise providing the first design to a viewer, receiving input for one or more additional considerations for the space and providing the second different design that incorporates the one or more additional considerations.

38. The system of claim 23, wherein the operations further comprise prior to evaluating, receiving input that defines the first and second different designs without the inclusion of a reconfigurable element, evaluating the first and second different designs, and wherein evaluating the library includes determining the reconfigurable element for inclusion in both the first and second different designs based on the evaluating the first and second different designs.

39. The system of claim 23 wherein the input includes at least two uses and wherein identifying plan information includes suggesting one or more candidate plans and receiving a selection of a plan.

40. The system of claim 23, wherein the operations further comprise providing a controller for configuring and reconfiguring the space based on the first and second different designs.

41. The system of claim 23 wherein the received input is parameter based and defines one or more parameters for uses, elements, or configurations of the space.

42. The system of claim 23 wherein the received input is rules based and defines one or more rules for uses, elements or configurations of the space.

43. The system of claim 23 wherein identifying constraints includes identifying an other constraint on the first or second different design.

44. The system of claim 43 wherein the other constraint is a cost of the reconfigurable element plus any additional elements required to support the first and second configurations.

45. A computer program product, encoded on one or more non-transitory computer storage media, comprising instructions that when executed by one or more computers cause the one or more computers to perform operations comprising:

identifying, by a computer-aided design (CAD) system comprising at least one computer programmed to determine and suggest reconfigurable elements for a design, plan information relating to a space under evaluation;

identifying, by the CAD system comprising the at least one computer, constraints related to structures associated with the plan information, wherein identifying constraints includes identifying at least one physical constraint;

receiving, by the CAD system comprising the at least one computer, input regarding uses or elements to be included in a reconfigurable design for the space, wherein receiving the input includes receiving at least a first use and at least a second different use;

evaluating, by the CAD system comprising the at least one computer, a library of elements for inclusion in the space including determining one or more reconfigurable elements that satisfy the received input including the first use and the second different use, wherein each of the one or more reconfigurable elements has more than one structural configuration effecting more than one function in the space, and the evaluating is based at least in part on the plan information, the constraints and the input;

determining, by the CAD system comprising the at least one computer, a first configuration of a reconfigurable element of the one or more reconfigurable elements, in accordance with the first use received as part of the input and in accordance with one or more rules that define relationships between locations of elements in the space, including a first placement in a first design associated with the space and presenting the first design including the reconfigurable element in accordance with the first configuration; and determining, by the CAD system comprising the at least one computer, a second different configuration of the reconfigurable element, in accordance with the second different use received as part of the input and in accordance with the one or more rules that define relationships between locations of elements in the space, including a second placement in a second different design associated with the same space and presenting the second different design including the reconfigurable element in accordance with the second different configuration, wherein the operations further include identifying one or more additional elements required to reconfigure the reconfigurable element into the first and second different configurations and adding the one or more additional elements into the first and second different designs, thereby forming the reconfigurable design for the space; and wherein the presenting the first and second different designs includes presenting alternative designs as suggestions to a viewer including different configurations of the reconfigurable element.

46. The computer program product of claim 45 wherein the plan information includes a plan that is selected from the group comprising a floor plan, a footprint or a lot plan.

47. The computer program product of claim 45 wherein identifying constraints includes determining one or more structures that are included in the space are reconfigurable.

48. The computer program product of claim 47 wherein evaluating the library includes determining a reconfigurable element for at least one other reconfigurable element having more than one structural configuration effecting more than one function when included in the space.

49. The computer program product of claim 45 wherein identifying constraints includes receiving constraint information from a user that identifies constraints associated with the space.

50. The computer program product of claim 45 wherein receiving input includes receiving an indication of an additional reconfigurable element to include in the first and second different designs, and wherein the operations further include determining a plurality of configurations for the additional reconfigurable element, determining one or more additional elements that are required to be included in the first and second different designs to enable reconfiguration of the additional reconfigurable element when in the first design as compared to when in the second different design, and adding the one or more additional elements to the first and second different designs.

51. The computer program product of claim 45 wherein the evaluating is automatic and wherein determining one or more reconfigurable elements includes determining one or more reconfigurable elements from the library.

52. The computer program product of claim 45 wherein the first placement and the second placement is the same and the reconfiguration of the reconfigurable element is changed in the first design and second design without changing a position of the reconfigurable element.

53. The computer program product of claim 45 wherein the first placement and the second placement is different, and wherein the operations further include determining one or more additional elements for inclusion in the first and second designs that are required to enable a change of location of the reconfigurable element from the first location to the second location.

54. The computer program product of claim 45 wherein the reconfigurable element is selected from the group comprising a wall structure, a furniture item, a table structure, a bookshelf, doors, windows, desks, tables, work surfaces, steps, shelves.

55. The computer program product of claim 45 wherein the one or more additional elements are selected from the group comprising pivots, tracks, pulleys, running boards.

56. The computer program product of claim 45, wherein the operations further comprise receiving an update to one or more of the input including update to a use or element, and the operations further comprising determining a new reconfigurable element or reconfiguring the reconfigurable element in accordance with the update.

57. The computer program product of claim 45 wherein the operations further comprise determining modifications to one or more elements included in the first design in order to enable the reconfiguration of the reconfigurable element from the first configuration to the second different configuration.

58. The computer program product of claim 45 wherein receiving input includes receiving rules that govern desired uses of the space, configuration of the space and elements in the space, preferences of the user and required elements to be included in one or more of the first or second different designs.

59. The computer program product of claim 45 wherein the operations further comprise providing the first design to a viewer, receiving input for one or more additional considerations for the space and providing the second different design that incorporates the one or more additional considerations.

60. The computer program product of claim 45, wherein the operations further comprise prior to evaluating, receiving input that defines the first and second different designs without the inclusion of a reconfigurable element, evaluating the first and second different designs, and wherein evaluating the library includes determining the reconfigurable element for inclusion in both the first and second different designs based on the evaluating the first and second different designs.

61. The computer program product of claim 45 wherein the input includes at least two uses and wherein identifying plan information includes suggesting one or more candidate plans and receiving a selection of a plan.

62. The computer program product of claim 45, wherein the operations further comprise providing a controller for configuring and reconfiguring the space based on the first and second different designs.

63. The computer program product of claim 45 wherein the received input is parameter based and defines one or more parameters for uses, elements, or configurations of the space.

64. The computer program product of claim 45 wherein the received input is rules based and defines one or more rules for uses, elements or configurations of the space.

65. The computer program product of claim 45 wherein identifying constraints includes identifying an other constraint on the first or second different design.

66. The computer program product of claim 65 wherein the other constraint is a cost of the reconfigurable element plus any additional elements required to support the first and second configurations.

\* \* \* \* \*